United States Patent
Plojhar

(10) Patent No.: US 12,095,366 B2
(45) Date of Patent: Sep. 17, 2024

(54) CURRENT LIMITING CIRCUIT

(71) Applicant: SEMICONDUCTOR COMPONENTS INDUSTRIES, LLC, Phoenix, AZ (US)

(72) Inventor: Jan Plojhar, Mokra Horakov (CZ)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 163 days.

(21) Appl. No.: 17/654,290

(22) Filed: Mar. 10, 2022

(65) Prior Publication Data

US 2022/0321004 A1 Oct. 6, 2022

Related U.S. Application Data

(60) Provisional application No. 63/171,453, filed on Apr. 6, 2021.

(51) Int. Cl.
| | |
|---|---|
| *H02M 3/156* | (2006.01) |
| *H02M 1/00* | (2006.01) |
| *H02M 1/08* | (2006.01) |
| *H03K 3/037* | (2006.01) |
| *H03K 4/08* | (2006.01) |

(52) U.S. Cl.
CPC ......... *H02M 3/156* (2013.01); *H02M 1/0025* (2021.05); *H02M 1/08* (2013.01); *H03K 3/037* (2013.01); *H03K 4/08* (2013.01)

(58) Field of Classification Search
CPC .... H02M 1/0009; H02M 1/0025; H02M 1/08; H02M 1/32; H02M 1/40; H02M 3/156–1588; H03K 3/037; H03K 4/08
See application file for complete search history.

(56) References Cited

U.S. PATENT DOCUMENTS

| | | | |
|---|---|---|---|
| 6,466,422 B2 | 10/2002 | Luo | |
| 7,518,348 B1 | 4/2009 | Kobayashi | |
| 8,089,743 B2 | 1/2012 | Jian | |
| 9,098,103 B1* | 8/2015 | Milanesi | H02M 3/156 |
| 10,432,087 B2* | 10/2019 | Krabbenborg | H02M 1/40 |

(Continued)

FOREIGN PATENT DOCUMENTS

| | | |
|---|---|---|
| WO | 2011159457 A2 | 12/2011 |
| WO | 2021154852 A1 | 8/2021 |

*Primary Examiner* — Fred E Finch, III

(74) *Attorney, Agent, or Firm* — Brake Hughes Bellermann LLP

(57) ABSTRACT

According to an aspect, a controller includes an error circuit configured to receive a clamping voltage and a feedback signal, the error circuit configured to generate a regulation reference signal based on the clamping voltage and the feedback signal, a PWM circuit configured to receive the regulation reference signal and a current sense signal, the PWM circuit configured to generate a limit signal or a regulation signal based on the regulation reference signal and the current sense signal, a clamp circuit configured to increase a magnitude of the clamping voltage in response to the regulation signal being an active state and decrease the magnitude of the clamping voltage in response to the limit signal being the active state, and a drive circuit configured to generate a drive signal for regulating the output current in response to at least one of the limit signal or the regulation signal.

19 Claims, 9 Drawing Sheets

(56) References Cited

U.S. PATENT DOCUMENTS

| | | | |
|---|---|---|---|
| 2007/0252567 A1 | 11/2007 | Dearn et al. | |
| 2007/0296389 A1* | 12/2007 | Chen | H02M 3/158 |
| | | | 323/290 |
| 2010/0164462 A1 | 7/2010 | Yen et al. | |
| 2010/0253309 A1 | 10/2010 | Xi et al. | |
| 2011/0062932 A1 | 3/2011 | Hawkes | |
| 2013/0257409 A1 | 10/2013 | Komiya | |
| 2017/0194858 A1* | 7/2017 | Villot | H02M 1/32 |
| 2018/0183331 A1 | 6/2018 | Chen | |
| 2021/0099082 A1* | 4/2021 | Romeo | H02M 3/156 |
| 2021/0234457 A1* | 7/2021 | Silva | H02M 1/32 |

* cited by examiner

CURRENT LIMITING CIRCUIT

CROSS REFERENCE TO RELATED APPLICATION

This application claims priority to and the benefit of U.S. Provisional Application No. 63/171,453, filed Apr. 6, 2021, the disclosure of which is incorporated by reference herein in its entirety.

BACKGROUND

A switching regulator may use one or more switches to convert an input voltage to an output voltage. A switching regulator may operate close to peak coil current but below a coil saturation current threshold.

SUMMARY

According to an aspect, a controller for a switching regulator includes an error circuit configured to receive a clamping voltage and a feedback signal representing an output voltage of the switching regulator, where the error circuit is configured to generate a regulation reference signal based on the clamping voltage and the feedback signal, a pulse width modulation (PWM) circuit configured to receive the regulation reference signal and a current sense signal representing an output current of the switching regulator, where the PWM circuit is configured to generate a limit signal or a regulation signal based on the regulation reference signal and the current sense signal, a clamp circuit configured to increase a magnitude of the clamping voltage in response to the regulation signal being an active state and decrease the magnitude of the clamping voltage in response to the limit signal being the active state, and a drive circuit configured to generate a drive signal for regulating the output current in response to at least one of the limit signal or the regulation signal.

According to some aspects, the error circuit includes an error amplifier configured to generate an error voltage based on a difference of a magnitude of the feedback signal and a reference voltage. The error circuit includes a voltage limiter configured to generate the regulation reference signal based on the error voltage and the clamping voltage. The error circuit includes a comparator connected to an output of the error amplifier, a switch connected to an output of the comparator, and a control register connected to a control input of the switch. The PWM circuit includes a current limiter comparator configured to activate the limit signal in response to a magnitude of the current sense signal being greater than a first reference voltage. The PWM circuit includes a combination circuit configured to combine a ramp signal with the current sense signal to generate a modified current sense signal and a regulation comparator configured to activate the regulation signal in response to a magnitude of the modified current sense signal being greater than a second reference voltage. The clamp circuit includes a clamp control sequencer configured to generate an increase signal in response to the regulation signal being activated, where the clamp control sequencer is configured to generate a decrease signal in response to the limit signal being activated. In response to the increase signal, the clamp control sequencer is configured to cause a first switch to transition to a closed position to connect a first current source to a capacitor, where the first current source is connected to an internal voltage. In response to the decrease signal, the clamp control sequencer is configured to cause a second switch to transition to a closed position to connect a second current source to the capacitor, where the second current source is connected to ground. The clamp control sequencer is configured to receive a clock signal and generate the increase signal or the decrease signal according to the clock signal. The PWM circuit includes a current limit comparator configured to cause activation of the limit signal, a regulation comparator configured to cause activation of the regulation signal, and one or more latches connected to at least one of an output of the current limit comparator or an output of the regulation comparator.

According to an aspect, a controller for a switching regulator includes an error circuit configured to receive a clamping voltage and a feedback signal representing an output voltage of the switching regulator, the error circuit configured to generate a regulation reference signal based on the clamping voltage and the feedback signal, a pulse width modulation (PWM) circuit including a current limit comparator configured to activate a limit signal in response to a magnitude of a current sense signal representing an output current being greater than a first reference voltage, and a regulation comparator configured to activate a regulation signal in response to a modified current sense signal being greater than the regulation reference signal, a clamp circuit configured to increase a magnitude of the clamping voltage in response to the regulation signal being activated and decrease the magnitude of the clamping voltage in response to the limit signal being activated, and a drive circuit configured to generate a drive signal for regulating the output current in response to at least one of the limit signal or the regulation signal.

According to some aspects, the PWM circuit includes a combination circuit configured to combine a ramp signal with the current sense signal to generate the modified current sense signal. The error circuit includes an error amplifier configured to generate an error voltage based on a difference of a magnitude of the feedback signal and a second reference voltage, and a voltage limiter configured to generate the regulation reference signal based on the error voltage and the clamping voltage. The error circuit includes an error amplifier configured to generate an error voltage based on a difference of a magnitude of the feedback signal and a second reference voltage, a comparator connected to an output of the error amplifier, a switch connected to an output of the comparator, and a control register connected to a control input of the switch. The PWM circuit includes a timing signal generator configured to generate a clock signal, a logic circuit connected to an output of the current limit comparator and an output of the regulation comparator, and a latch having a first input configured to receive the clock signal and a second input connected to an output of the logic circuit. The PWM circuit includes a timing signal generator configured to generate a clock signal, a first latch having a first input connected to an output of the current limit comparator and a second input configured to receive the clock signal, a second latch having a first input connected to an output of the regulation comparator and a second input configured to receive the clock signal, and a logic circuit having a first input connected to an output of the first latch, a second input connected to an output of the second latch, and a third input configured to receive the clock signal. The clamp circuit includes a clamp control sequencer configured to receive the limit signal and the regulation signal, a first current source connected to an internal voltage, a second current source connected to ground, a first switch connected to the first current source and a node, the first switch configured to transition to a closed state in response to the limit signal being activated, a second switch connected to the second current source and the node, the second switch configured to transition to a closed state in response to the regulation signal being activated, and a capacitor connected to the node.

According to an aspect, a method of controlling a switching regulator includes generating a regulation reference signal based on a clamping voltage and a feedback signal representing an output voltage of the switching regulator, generating at least one of a limit signal or a regulation signal based on the regulation reference signal and a current sense signal representing an output current of the switching regulator, increasing a magnitude of the clamping voltage in response to the regulation signal being an active state, decreasing the magnitude of the clamping voltage in response to the limit signal being an active state, and generating a drive signal for regulating the output current in response to at least one of the limit signal or the regulation signal.

According to some aspects, the method may include activating the limit signal in response to a magnitude of the current sense signal being greater than a reference voltage. The method may include generating a ramp signal, combining the ramp signal with the current sense signal to generate a modified current sense signal and activating the regulation signal in response to a magnitude of the modified current sense signal being greater than a reference voltage. The method may include generating a PWM output signal based on at least one of the limit signal or the regulation signal and generating the drive signal based on the PWM output signal, the drive signal configured to control a switching operation of a power switch.

According to an aspect, a controller for a switching regulator includes a pulse width modulation (PWM) circuit configured to receive a regulation reference signal representing a threshold voltage level and a current sense signal representing an output current of the switching regulator, the PWM circuit configured to generate a limit signal or a regulation signal based on the regulation reference signal and the current sense signal, a clamp circuit configured to increase a magnitude of a clamping voltage in response to the regulation signal being in an active state and decrease the magnitude of the clamping voltage in response to the limit signal being in the active state, an error circuit configured to adjust the regulation reference signal based on the clamping voltage, and a drive circuit configured to generate a drive signal for regulating the output current in response to at least one of the limit signal or the regulation signal.

DETAILED DESCRIPTION

This description relates to a switching regulator that includes a current limiter circuit that may allow the switching regulator to operate close to (or at) a peak current threshold, thereby increasing the efficiency of the switching regulator. Also, the current limiter circuit may reduce (or eliminate) current overshoots or undershoots and/or may reduce (or prevent) subharmonic oscillations, which can provide smooth transitions into (and out of) a current limit mode.

Figure 1A:
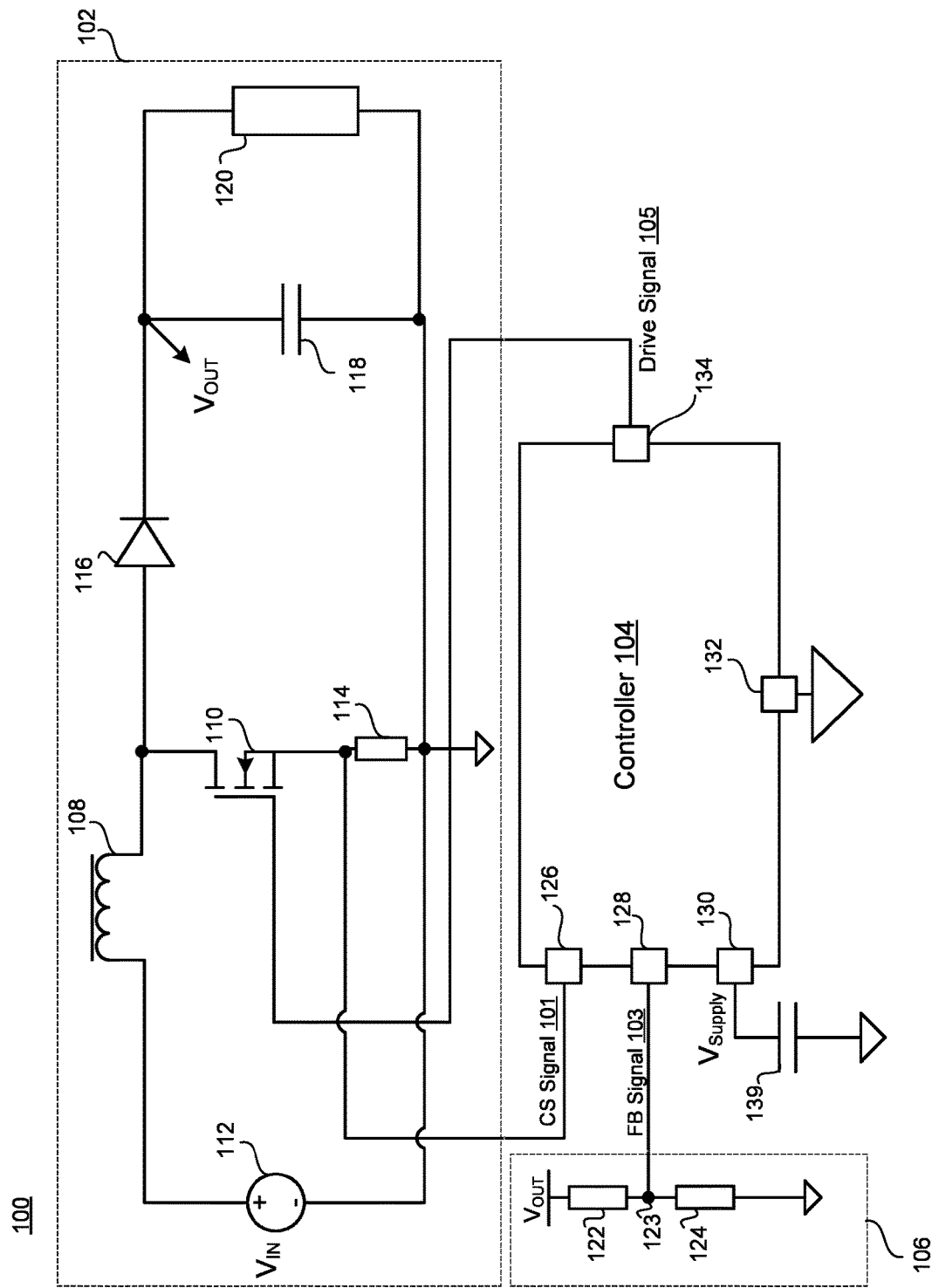
FIG. 1A illustrates a switching regulator according to an aspect.
Figure 1B:
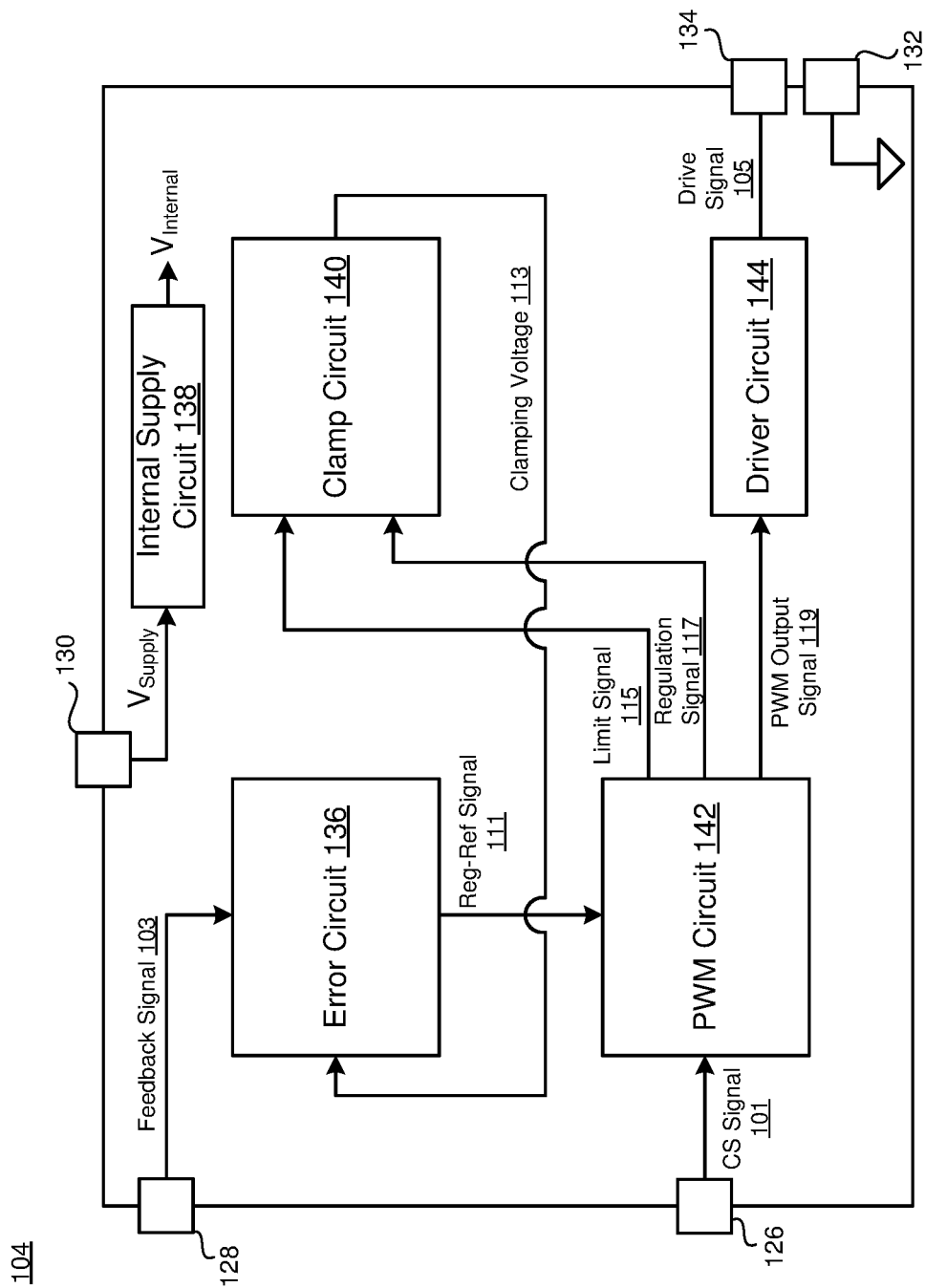
FIG. 1B illustrates a controller of the switching regulator according to an aspect.
Figure 1C:
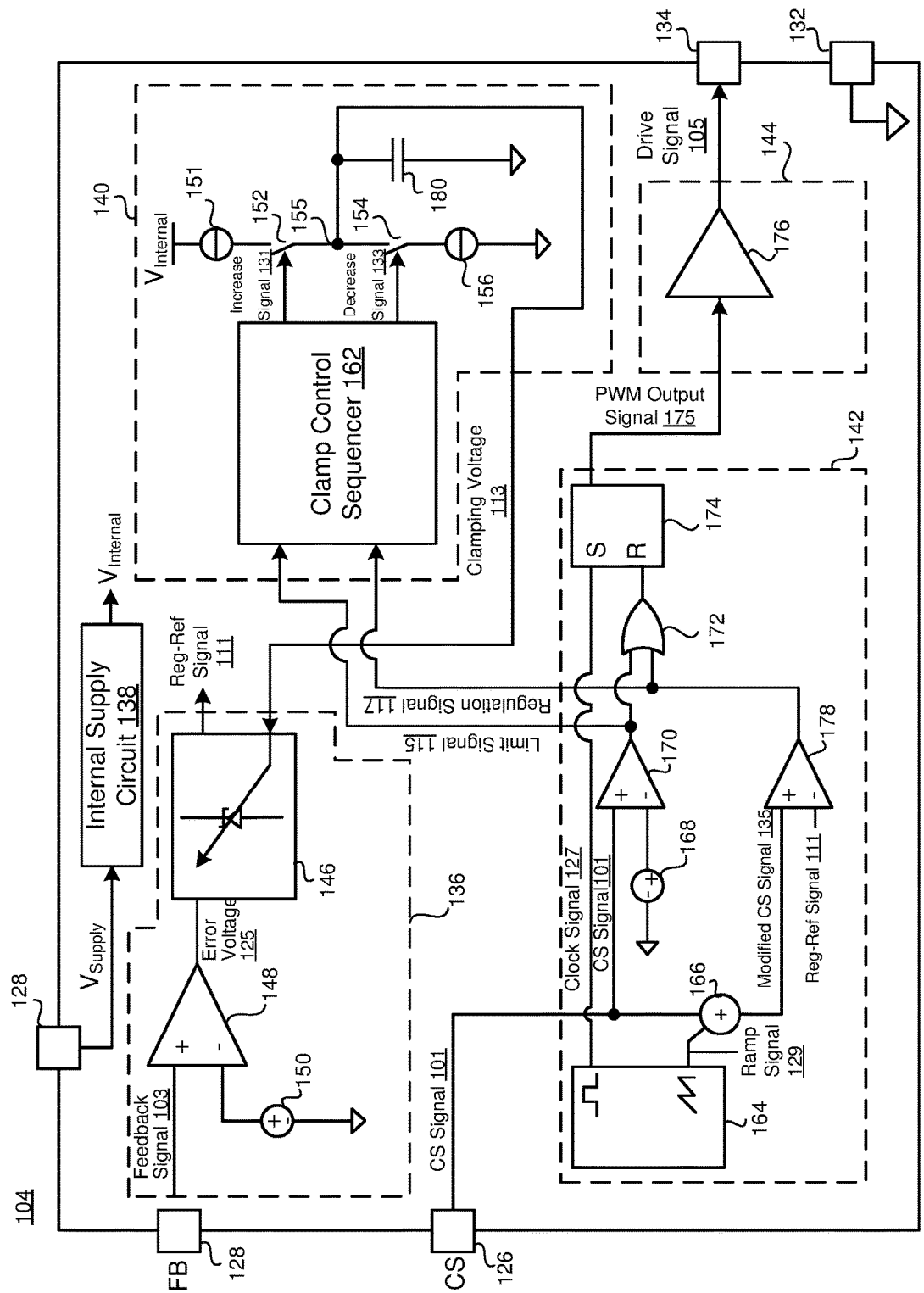
FIG. 1C illustrates a controller of the switching regulator according to another aspect.

FIGS. 1A through 1C illustrate an example of a switching regulator 100 according to an aspect. The switching regulator 100 may receive an input voltage ($V_{in}$) 112 and generate an output voltage ($V_{out}$). The switching regulator 100 may be a voltage converter. In some examples, the switching regulator 100 is direct current to direct current (DC-DC) converter and may include any type of DC-DC topology with any number of phases.

As shown in FIG. 1A, the switching regulator 100 includes a power stage 102, a feedback signal generator 106, and a controller 104. The power stage 102 may convert an input voltage ($V_{in}$) 112 to an output voltage ($V_{out}$). Although one power stage 102 is depicted in FIG. 1A, the switching regulator 100 may include any number of power stages 102 including two power stages 102 or more than two power stages 102. A power stage 102 may encompass one of a wide variety of topologies such as a buck converter, boost converter, inverting buck-boost converter, fly-back converter, active clamp forward converter, single switch forward converter, two switch forward converter, push-pull converter, half-bridge converter, full-bridge converter, phase-shifted full-bridge converter, etc. In some examples, the power stage 102 includes a switching resonant converter.

The power stage 102 may include a plurality of circuit components such as diodes, switches (e.g., transistors, field-effect transistors (FETs), metal-oxide-semiconductor field effect transistors (MOSFETs)), capacitors, inductors, and/or transformers, etc. The power stage 102 may include an inductor 108, a power switch 110, a diode 116, a capacitor 118, and a sense resistor 114. Although one power switch 110 is depicted in FIG. 1A, the power stage 102 may include any number of switches. In some examples, the power switch 110 includes a field effect transistor (FET).

The inductor 108 has a first terminal for receiving the input voltage ($V_{in}$) 112 and a second terminal connected to the diode 116 and the power switch 110. The diode 116 has an anode connected to the inductor 108 and a cathode for providing the output voltage ($V_{out}$). The capacitor 118 has a first terminal connected to the cathode of the diode 116 and a second terminal connected to ground. A load 120 has a first terminal connected to the cathode of the diode 116 and a second terminal connected to ground. The sense resistor 114 may be connected in series with the power switch 110. The sense resistor 114 may be disposed between the power switch 110 and the ground. The voltage over the sense resistor 114 may represent a level of the output current.

The feedback signal generator 106 may receive the output voltage ($V_{out}$) and generate a feedback signal 103 that represents the level of output voltage ($V_{out}$). In some examples, the feedback signal 103 is a scaled-down version of the output voltage ($V_{out}$). The feedback signal generator 106 includes a resistor 122 and a resistor 124. The resistor 122 is connected in series with the resistor 124. In some examples, the resistor 122 is connected to the cathode of the diode 116. A node 123 is disposed between the resistor 122 and the resistor 124. The voltage on the node 123 may represent the feedback signal 103.

The controller 104 is configured to generate a drive signal 105 for driving the power switch 110 based on the current sense signal 101 and the feedback signal 103. The controller 104 includes a current sense terminal 126 configured to receive the current sense signal 101. The current sense terminal 126 may be connected to a terminal of the sense resistor 114. The controller 104 may include a feedback terminal 128 configured to receive the feedback signal 103. The feedback terminal 128 may be connected to the node 123 of the feedback signal generator 106. The controller 104 includes a supply voltage terminal 130 configured to receive a supply voltage ($V_{supply}$). The supply voltage terminal 130 may be connected to a supply capacitor 139 configured to generate the supply voltage ($V_{supply}$). The controller 104 may include a ground terminal 132 connected to ground. The controller 104 may generate a drive signal 105 that drives the power switch 110. The controller 104 includes a drive terminal 134 connected to a gate of the power switch 110. The drive terminal 134 may output the drive signal 105 to drive the gate of the power switch 110, which controls the switching operations of the power switch 110.

FIG. 1B illustrates an example of the controller 104 according to an aspect. The controller 104 may regulate the output of the power stage 102 with reduced subharmonic oscillations and a maximum power output near the saturation current of the converter coil (e.g., the inductor 108). The controller 104 may be included within an integrated circuit package. The controller 104 includes an error circuit 136, an internal supply circuit 138, a clamp circuit 140, a pulse width modulation (PWM) circuit 142, and a driver circuit 144.

The error circuit 136 may receive the feedback signal 103 from the feedback terminal 128 and a clamping voltage 113 from the clamp circuit 140. The error circuit 136 may generate a regulation-reference signal 111 using the feedback signal 103 and the clamping voltage 113. As shown in FIG. 1B, the error circuit 136 is connected to the feedback terminal 128, and the error circuit 136 is connected to an output of the clamp circuit 140.

The internal supply circuit 138 may receive the supply voltage ($V_{supply}$) from the supply voltage terminal 130 and generate an internal voltage ($V_{internal}$). The internal supply circuit 138 is connected to the supply voltage terminal 130. In some examples, as shown in FIG. 1C, the clamp circuit 140 uses the internal voltage ($V_{internal}$) generated by the internal supply circuit 138.

The PWM circuit 142 may receive the current sense signal 101 from the current sense terminal 126 and the regulation-reference signal 111 from the error circuit 136. The PWM circuit 142 may be connected to the current sense terminal 126, and the PWM circuit 142 may be connected to an output of the error circuit 136. The PWM circuit 142 may generate a limit signal 115, a regulation signal 117, and a PWM out signal 119. Based on the regulation-reference signal 111 and the current sense signal 101, the PWM circuit 142 is configured to generate the limit signal 115, the regulation signal 117, and the PWM out signal 119.

The driver circuit 144 may receive the PWM out signal 119 from the PWM circuit 142 and generate the drive signal 105 to drive the power switch 110. The limit signal 115 and the regulation signal 117 are signals that are provided to the clamp circuit 140. The clamp circuit 140 may receive the limit signal 115 and the regulation signal 117 and may generate the clamping voltage 113, which is provided to the error circuit 136.

As shown in FIG. 1C, the error circuit 136 may include an error amplifier 148 and a controlled voltage limiter 146. The error amplifier 148 includes a first input (e.g., a non-inverting input) configured to receive the feedback signal 103 and a second input (e.g., an inverting input) configured to receive a first reference voltage provided by a voltage source 150. The error amplifier 148 may compare the magnitude of the feedback signal 103 and the first reference voltage and generate, based on the comparison, an error voltage 125. The output of the error amplifier 148 is limited by the controlled voltage limiter 146 so that the error voltage 125 cannot exceed the level defined by the limiter control signal. The controlled voltage limiter 146 may receive the output (e.g., the error voltage 125) of the error amplifier 148 and the output (e.g., the clamping voltage 113) of the clamp circuit 140 and generate the regulation-reference signal 111. For example, the controlled voltage limiter 146 may adjust the error voltage 125 based on the magnitude of the clamping voltage 113, thereby generating the regulation-reference signal 111.

The PWM circuit 142 includes a timing signal generator 164, a combination circuit 166, a current limit comparator 170, and a regulation comparator 178. In some examples, the PWM circuit 142 includes a logic circuit 172 and a latch 174.

The timing signal generator 164 may generate a clock signal 127 and a ramp signal 129. The ramp signal 129 includes a voltage that increases according to, for example, a voltage slope. The combination circuit 166 may receive the current sense signal 101 and the ramp signal 129 and generate a modified current sense signal 135. In some examples, the combination circuit 166 includes a summing circuit that adds two or more signals together. In some examples, the modified current sense signal 135 includes a ramped current sense signal. For example, the combination circuit 166 may combine (or add) the ramp signal 129 with (to) the current sense signal 101 to generate the modified current sense signal 135. The injection of the ramp signal 129 into the current sense signal 101 may reduce or prevent subharmonic oscillations. The modified current sense signal 135 may include a voltage signal having a voltage slope, where the voltage signal corresponds to the current sense signal 101 over a period of time and the voltage slope has the slope of the ramp signal 129.

The current limit comparator 170 includes a first input (e.g., a non-inverting input) configured to receive the current sense signal 101 and a second input (e.g., an inverting input) configured to receive a second reference signal provided by a voltage source 168. The current limit comparator 170 may compare the magnitude of the current sense signal 101 to the second reference signal, and, in response to the magnitude of the current sense signal 101 being greater than the second reference signal, the current limit comparator 170 may generate a limit signal 115. The limit signal 115 may have a logic low state or a logic high state. In examples, the activation of the limit signal 115 (e.g., the limit signal 115 having the logic high state) indicates that the switching regulator 100 has reached a current limit threshold (e.g., has entered a current limit mode). As indicated above, the current sense signal 101 may indicate a magnitude of the output current (e.g., the current through the inductor 108), and if the magnitude of the output current (as represented by the current sense signal 101) is greater than the second reference signal, the current limit comparator 170 may activate the limit signal 115 to limit the amount of current through the inductor 108. The limit signal 115 is provided to the clamp circuit 140.

The current limit comparator 170 may terminate the proceeding active pulse if the current sense signal 101 has exceeded the second reference signal, which can reduce or prevent overshoot events (e.g., overcurrent events). The current limit comparator 170 may compare a sample of the switching current with the second reference signal. For example, the current sense signal 101 may be a voltage that represents the current through the power switch 110. The current limit comparator 170 may activate a logic high for the limit signal 115 if the switching current is greater than the second reference signal (e.g., the current limit comparator 170 toggles). Current limit comparator toggling may indicate that the clamping voltage 113 will be decreased. For instance, the current limit comparator 170 may prevent the monitored switching current from rising above a predetermined current level (e.g., as represented by the second reference signal).

The regulation comparator 178 may provide peak current or converter power level to correspond to the error voltage 125. For instance, the error amplifier 148 may drive (e.g., steer) the peak current so that the output voltage remains regulated. The regulation comparator 178 includes a first input (e.g., a non-inverting input) configured to receive the modified current sense signal 135 from the combination circuit 166 and a second input (e.g., an inverting input) configured to receive the regulation-reference signal 111 from the error circuit 136. The regulation comparator 178 may compare the magnitude of the modified current sense signal 135 with the magnitude of the regulation-reference signal 111, and, in response to the magnitude of the modified current sense signal 135 being greater than the magnitude of the regulation-reference signal 111, the regulation comparator 178 may generate (e.g., activate) a regulation signal 117 (e.g., the regulation comparator 178 toggles). Regulation comparator toggling may indicate that the clamping voltage 113 will be increased. In some examples, generation of the regulation signal 117 causes the regulation signal 117 to have a logic high level. The regulation signal 117 is provided to the clamp circuit 140.

Similar to the current limit comparator 170, the regulation comparator 178 may terminate the proceeding active pulse if the magnitude of the modified current sense signal 135 is greater than the magnitude of the regulation-reference signal 111. The regulation comparator 178 may compare the magnitude of the modified current sense signal 135 with the magnitude of the regulation-reference signal 111 (e.g., outputted by the error circuit 136), and, if the magnitude of the modified current sense signal 135 is greater than magnitude of the regulation-reference signal 111, the regulation comparator 178 may activate a logic high for the regulation signal 117. In some examples, the logic high state for the regulation signal 117 may indicate that the peak current (or converter power level) is not following (e.g., does not correspond to) the regulation-reference signal 111. In some examples, the logic low state for the regulation signal 117 may indicate that the peak current (or converter power level) is following (e.g., corresponds to) the regulation-reference signal 111. In some examples, the PWM circuit 142 includes a leading edge blanking and/or filtering circuit to reduce or prevent current spikes from triggering the current limit comparator 170.

The logic circuit 172 may receive the output of the current limit comparator 170 and the output of the regulation comparator 178. In some examples, the logic circuit 172 includes an OR gate having a first input connected to the output of the current limit comparator 170 and a second input connected to the output of the regulation comparator 178. The output of the logic circuit 172 is connected to the latch 174. In some examples, the latch 174 includes a set-reset (SR) latch having a set input configured to receive the clock signal 127 and a reset input connected to the output of the logic circuit 172. The latch 174 may generate a PWM output signal 175. The driver circuit 144 includes a gate driver 176. The gate driver 176 includes an input connected to the output of the latch 174 and configured to receive the PWM output signal 175. The gate driver 176 is configured to generate the drive signal 105 in response to the PWM output signal 175. The gate driver 176 has an output connected to the drive terminal 134.

The clamp circuit 140 may monitor the limit signal 115 and the regulation signal 117 and adjust the magnitude of the clamping voltage 113. In some examples, the clamp circuit 140 adjusts the magnitude of the clamping voltage 113 to set a clamp limit level for the magnitude of the regulation-reference signal 111. Generally, when the regulation comparator 170 toggles first (e.g., the modified current sense signal 135 is greater than the regulation-reference signal 111), the clamp circuit 140 may gradually increase (e.g., one step at a time) the voltage steering the controlled voltage limiter 146 (e.g., the clamping voltage 113) so that the error voltage 125 (e.g., the main switch current) is allowed to increase. When the current limit comparator 170 toggles first (e.g., the current sense signal 101 is greater than the reference voltage provided by the voltage source 168), the clamp circuit 140 may gradually decrease (e.g., one step at a time) the voltage steering the controlled voltage limiter 146 (e.g., the clamping voltage 113) so that the error voltage 125 is forced to decrease. In some examples, when in an overload situation, the controlled voltage limiter 146 is clamping the error voltage 125 (e.g., reducing the regulation-reference signal 111 which is used by the regulation comparator 178), an equilibrium may be maintained as the current limit comparator 170 and the regulation comparator 178 are alternating, so maintaining the peak current imposed by both comparators.

The clamp circuit 140 includes a clamp control sequencer 162. The clamp control sequencer 162 may receive the limit signal 115 and the regulation signal 117. Based on at least one of the limit signal 115 or the regulation signal 117, the clamp control sequencer 162 may generate an increase signal 131 or a decrease signal 133 to adjust the magnitude of the clamping voltage 113. In some examples, the magnitude of clamping voltage 113 may be increased or decreased in response to an output of the current limit comparator 170 or the regulation comparator 178. In some examples, the resulting magnitude of the regulation-reference signal 111 is a voltage that represents a current similar to the peak current in the converter coil (e.g., within the inductor 108).

The clamp circuit 140 includes a current source 151 connected to the internal voltage ($V_{internal}$), a switch 152, a switch 154, a current source 156 connected to ground (e.g., the ground terminal 132), and a capacitor 180 connected to ground (e.g., the ground terminal 132). The switch 152 has a first terminal connected to the current source 151 and a second terminal connected to node 155. The switch 152 may receive the increase signal 131. The increase signal 131 may have a logic high state or a logic low state. In some examples, activation of the increase signal 131 causes the increase signal 131 to transition to the logic high state. The increase signal 131 may cause switch 152 to transition between a closed state (in which the current source 151 is connected to the node 155) and an open state (in which the current source 151 is disconnected from the node 155). In some examples, when the increase signal 131 is activated (e.g., a logic high state), the switch 152 transitions to the closed state, which causes the clamping voltage 113 to increase, thereby allowing more current through the inductor 108. The capacitor 180 has a first terminal connected to the node 155 and a second terminal connected to ground (e.g., the ground terminal 132).

The switch 154 has a first terminal connected to the node 155 and a second terminal connected to the current source 156. The switch 154 may receive the decrease signal 133. The decrease signal 133 may have a logic low state or a logic high state. The decrease signal 133 causes switch 154 to transition between a closed state (in which the current source 156 is connected to the node 155) and an open state (in which the current source 156 is disconnected from the node 155). In some examples, when the decrease signal 133 is activated (e.g., a logic high state), the switch 154 transitions to the closed state, which causes the clamping voltage 113 to decrease, thereby limiting the current through the inductor 108.

The magnitude of the clamping voltage 113 is decreased in response to the current sense signal 101 is greater than the second reference voltage. For example, in response to the current sense signal 101 being greater than the second reference voltage, the current limit comparator 170 may generate a logic high state for the limit signal 115. The clamp control sequencer 162 detects the logic high state of the limit signal 115 and may activate the switch 152 to be in the open position and may activate the switch 154 to be in the closed position, which causes the magnitude of the clamping voltage 113 to decrease.

The magnitude of the clamping voltage 113 may be increased when the modified current sense signal 135 is greater than the regulation-reference signal 111. For example, in response to the modified current sense signal 135 being greater than the regulation-reference signal 111, the regulation comparator 178 may generate a logic high state for the regulation signal 117. The clamp control sequencer 162 detects the logic high state of the regulation signal 117 and may activate the switch 152 to be in the closed position and may activate the switch 154 to be in the open position, which causes the magnitude of the clamping voltage 113 to increase.

During an overload situation, the controller 104 may limit (e.g., clamp) the regulation-reference signal 111 according to the magnitude of the clamping voltage 113. In some examples, an equilibrium may be maintained as the current limit comparator 170 and the regulation comparator 178 alternate in asserting their respective outputs at logic high states. The peak current during an overload condition may be controlled by the current limit comparator 170 and the regulation comparator 178. The injected slope compensation signal (e.g., modified current sense signal 135) may reduce jittering when operating at peak current.

Figure 2:
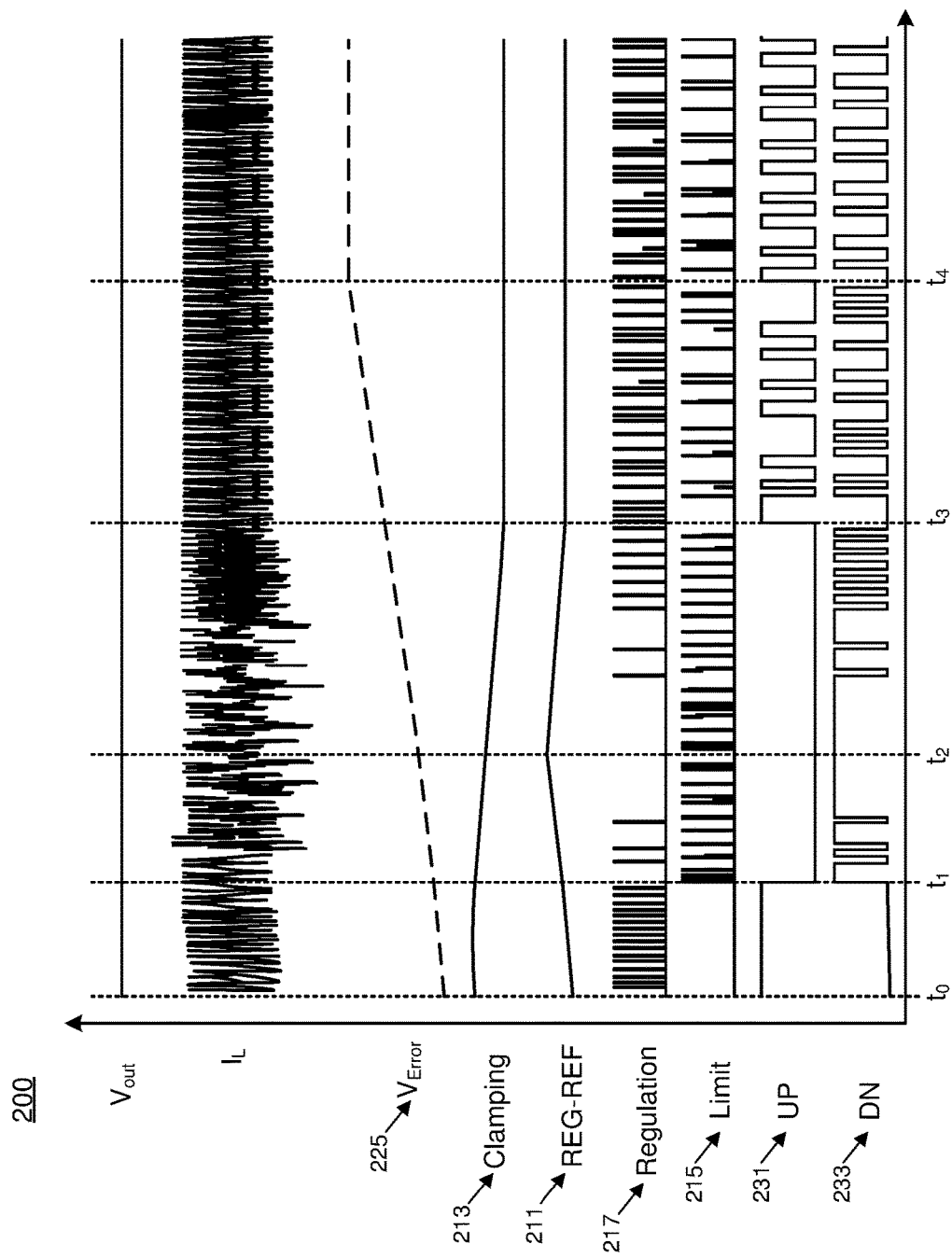
FIG. 2 illustrates a timing diagram depicting various signals generated by a switching regulator according to an aspect.

FIG. 2 illustrates a timing diagram 200 of the operations of a switching regulator (e.g., the switching regulator 100 of FIGS. 1A through 1C). The timing diagram 200 depicts the output voltage ($V_{out}$), the inductor current ($I_L$), an error voltage 225 (e.g., the error voltage 125 of FIGS. 1A through 1C), a clamping voltage 213 (e.g., the clamping voltage 113 of FIGS. 1A through 1C), a regulation-reference signal 211 (e.g., the regulation-reference signal 111 of FIGS. 1A through 1C), a regulation signal 217 (e.g., the regulation signal 117 of FIGS. 1A through 1C), a limit signal 215 (e.g., the limit signal 115 of FIGS. 1A through 1C), an increase signal 231 (e.g., the increase signal 131 of FIGS. 1A through 1C), and a decrease signal 233 (e.g., the decrease signal 133 of FIGS. 1A through 1C).

At time instance ($t_0$), a controller (e.g., the controller 104) is regulating the output current according to the regulation signal 217. When the regulation signal 217 is in the logic high state, the magnitude of the clamping voltage 213 is increased by one step (up to a maximum voltage) via the increase signal 231. At time instance ($t_1$), the inductor current ($I_L$) reaches the predetermined current limit and the limit signal 215 transitions to the logic high state. At this time, the decrease signal 233 decreases the magnitude of the clamping voltage 213 by one step. During the period between the time instance ($t_1$) and the time instance ($t_2$), the controller adjusts the magnitude of the clamping voltage 213 as the current limit comparator 170 of FIGS. 1A through 1C toggles (e.g., generates a logic high value for the limit signal 215). In some examples, the regulation signal 217 briefly transitions to the logic high state, but a blanking function may prevent the increase signal 231 from increasing the magnitude of the clamping voltage 213. During this period, the error voltage 225 continues to increase and the clamping voltage 213 continues to decrease.

At the time instance ($t_2$), the controlled voltage limiter 146 of FIGS. 1A through 1C begins to clamp the regulation-reference signal 211 to the magnitude of the clamping voltage 213. During the period between the time instance ($t_2$) and the time instance ($t_3$), the clamping voltage 213 is further decreased when the limit signal 215 transitions to the logic high state. At the time instance ($t_3$), the inductor current ($I_L$) begins to stabilize. The clamp control sequencer 162 of FIGS. 1A through 1C begins to alternately assert the increase signal 231 and the decrease signal 233 in logic high states in response to the regulation signal 217 and the limit signal 215, respectively. At the time instance ($t_4$) the maximum output power of the switching regulator 100 of FIGS. 1A through 1C is reached and the clamping voltage 213 is stabilized. In the timing diagram 200, the limit signal 215 and the regulation signal 217 are shown as toggling pulse signals. In some examples, the limit signal 215 and the regulation signal 217 may remain in logic high or logic low states depending on their inputs.

Figure 3:
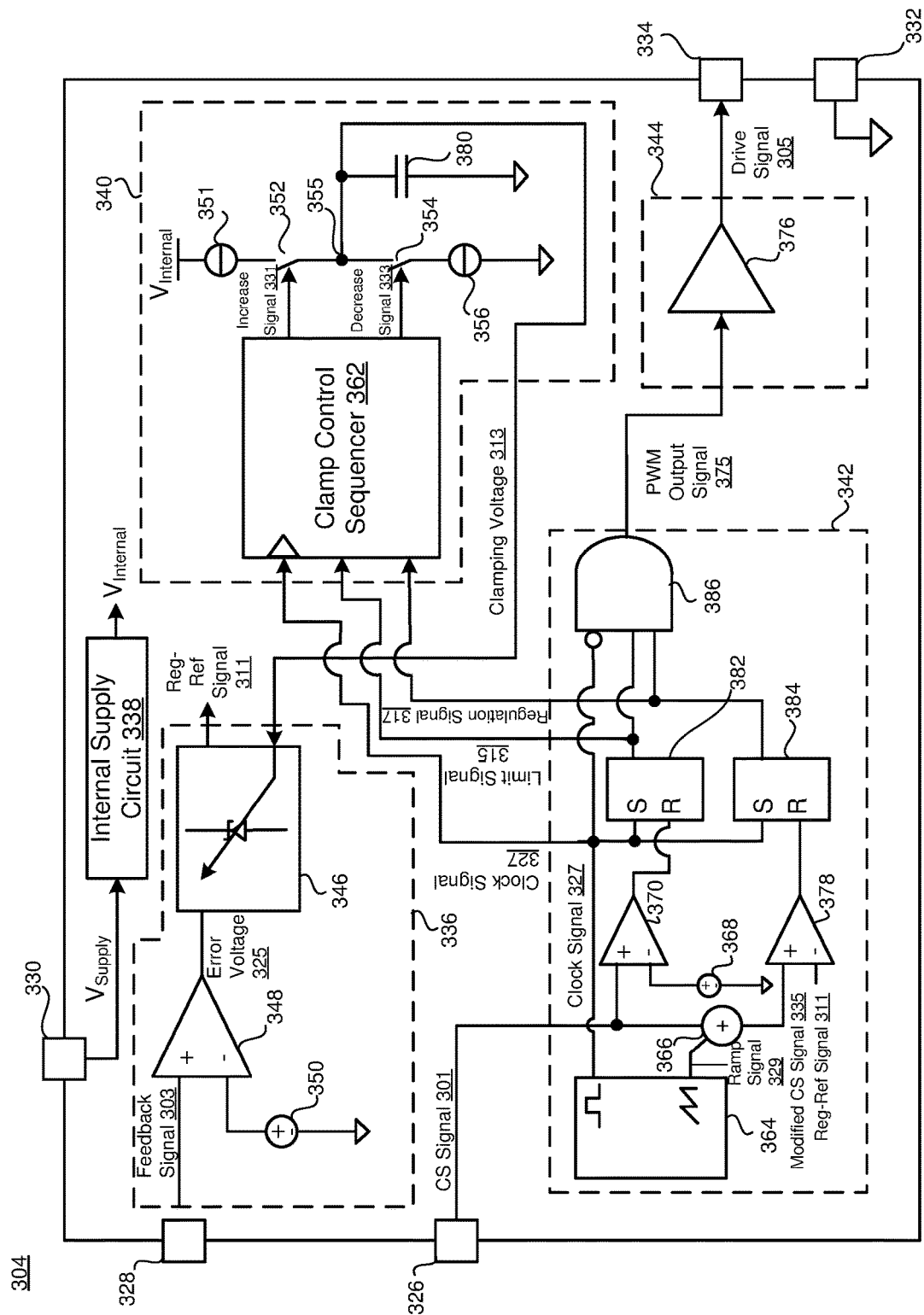
FIG. 3 illustrates an example of a controller of a switching regulator according to an aspect.

FIG. 3 illustrates a controller 304 according to another aspect. The controller 304 may be an example of the controller 104 of FIGS. 1A through 1C and may include any of the details discussed with reference to those figures. The controller 304 may be similar to the controller 104 of FIGS. 1A through 1C except that a clamp control sequencer 362 is implemented as a synchronous state machine with a clock input for receiving a clock signal 327 from a PWM circuit 342.

The controller 304 includes an error circuit 336, an internal supply circuit 338, a clamp circuit 340, a PWM circuit 342, and a driver circuit 344. The internal supply circuit 338 receives a supply voltage ($V_{supply}$) from a voltage supply terminal 330 and generates an internal voltage ($V_{internal}$). The error circuit 336 receives a feedback signal 303 from a feedback terminal 328 and generates a regulation-reference signal 311. The error circuit 336 includes an error amplifier 348 having a first input (e.g., non-inverting input) configured to receive the feedback signal 303 and a second input (e.g., inverting input) configured to receive a first reference voltage provided by a voltage source 350. The error amplifier 348 may generate an error voltage 325. The error circuit 336 includes a controlled voltage limiter 346 configured to receive the error voltage 325 and a clamping voltage 313 and generate the regulation-reference signal 311.

The PWM circuit 342 may receive a current sense signal 301 from a current sense terminal 326 and generate a PWM output signal 375, which is provided to the driver circuit 344. Also, the PWM circuit 342 may generate a plurality of signals provided to the clamp circuit 340 such as a clock signal 327, a limit signal 315, and a regulation signal 317. The PWM circuit 342 may include a timing signal generator 364 configured to generate a clock signal 327 and a ramp signal 329, and a combination circuit 366 configured to combine the current sense signal 301 and the ramp signal 329 to generate a modified current sense signal 335. The PWM circuit 342 includes a current limit comparator 370 having a first input (e.g., non-inverting input) configured to receive the current sense signal 301 and a second input (e.g., an inverting input) configured to receive a second reference signal provided by a voltage source 368. The current limit comparator 370 is configured to output a logic high level in response to the current sense signal 301 being greater than the second reference signal. The PWM circuit 342 includes a regulation comparator 378 having a first input (e.g., a non-inverting input) configured to receive the modified current sense signal 335 and a second input (e.g., an inverting input) configured to receive the regulation-reference signal 311. The PWM circuit 342 is configured to generate a logic high level in response to the magnitude of the modified current sense signal 335 being greater than the magnitude of the regulation-reference signal 311.

The PWM circuit 342 includes a latch 382 and a latch 384. In some examples, the latch 382 includes an SR latch. In some examples, the latch 384 includes an SR latch. The output of the current limit comparator 370 is connected to the latch 382. The output of the current limit comparator 370 may be connected to a reset input of the latch 382, and a set input of the latch 382 is configured to receive the clock signal 327. The output of the regulation comparator 378 is connected to the latch 384. The output of the regulation comparator 378 may be connected to a reset input of the latch 384, and a set input of the latch 384 is configured to receive the clock signal 327.

In response to the magnitude of the current sense signal 301 being greater than the second reference voltage, the current limit comparator 370 may generate a logic high level, which, when received at the reset input of the latch 382, causes the latch 382 to generate a limit signal 315, which is provided to the clamp circuit 340. In response to the magnitude of the modified current sense signal 335 being greater than the magnitude of the regulation-reference signal 311, the regulation comparator 378 may generate a logic high level, which, when received at the reset input of the latch 384, causes the latch 384 to generate a regulation signal 317, which is provided to the clamp circuit 340.

The PWM circuit 342 includes a logic circuit 386 configured to receive the clock signal 327, the output of the latch 382, and the output of the latch 384. In some examples, the logic circuit 386 includes an AND gate with an inverted input configured to receive the clock signal 327, a first non-inverting input connected to the output of the latch 382, and a second non-inverting input connected to the output of the latch 384.

The logic circuit 386 may generate a PWM output signal 375. The driver circuit 344 includes a gate driver 376. The gate driver 376 includes an input connected to the output of the logic circuit 386 and configured to receive the PWM output signal 375. The gate driver 376 is configured to generate the drive signal 305 in response to the PWM output signal 375. The gate driver 376 has an output connected to a drive terminal 334. The controller 304 also has a ground terminal 332.

The clamp circuit 340 may monitor the limit signal 315 and the regulation signal 317 and adjust the magnitude of the clamping voltage 313. In the example of FIG. 3, the clamp circuit 340 also receives the clock signal 327. In some examples, the clamp circuit 340 adjusts the magnitude of the clamping voltage 313 to set a clamp limit level for the magnitude of the regulation-reference signal 311. The clamp circuit 340 includes a clamp control sequencer 362. The clamp control sequencer 362 may receive the limit signal 315, the regulation signal 317, and the clock signal 327, and may generate an increase signal 331 or a decrease signal 333.

The clamp control sequencer 362 may increase the magnitude of the clamping voltage 313 when the regulation signal 317 has a logic low level and may decrease the magnitude of the clamping voltage 313 when the limit signal 315 has a logic low state. The clamp circuit 340 includes a current source 351 connected to the internal voltage ($V_{internal}$), a switch 352, a switch 354, a current source 356 connected to ground (e.g., the ground terminal 332), and a capacitor 380 connected to ground (e.g., the ground terminal 332). The switch 352 has a first terminal connected to the current source 351 and a second terminal connected to node 355. In some examples, when the increase signal 331 is activated (e.g., a logic high state), the switch 352 transitions to the closed state, which causes the clamping voltage 313 to increase, thereby allowing more current through the inductor. The capacitor 380 has a first terminal connected to the node 355 and a second terminal connected to ground (e.g., the ground terminal 332).

The switch 354 has a first terminal connected to the node 355 and a second terminal connected to the current source 356. The switch 354 is configured to receive the decrease signal 333. In some examples, when the decrease signal 333 is activated (e.g., a logic high state), the switch 354 transitions to the closed state, which causes the clamping voltage 313 to decrease, thereby limiting the current through the inductor.

Figure 4:
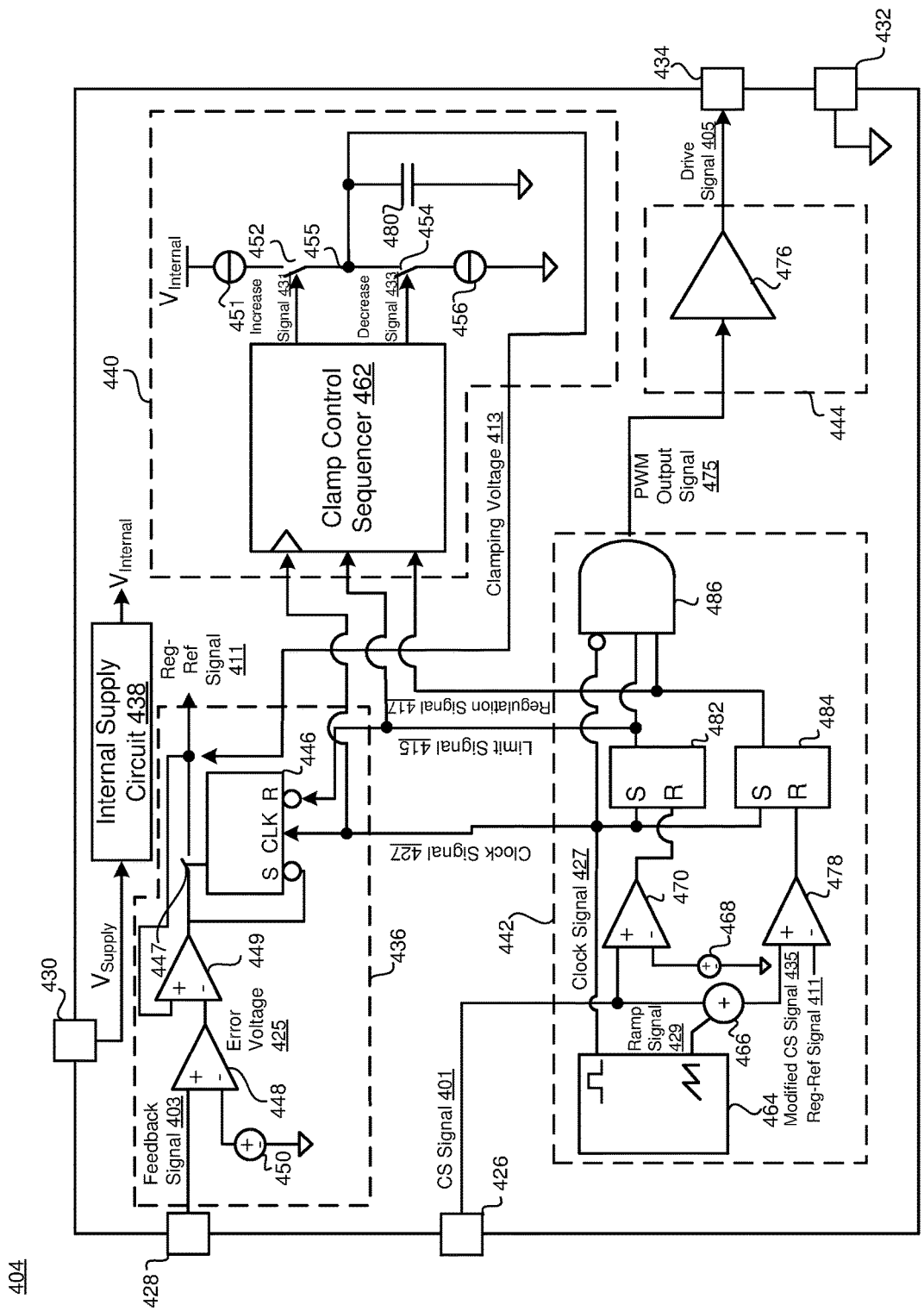
FIG. 4 illustrates an example of a controller of a switching regulator according to another aspect.

FIG. 4 illustrates a controller 404 according to another aspect. The controller 404 may be an example of the controller 104 of FIGS. 1A through 1C and/or the controller 304 of FIG. 3 and may include any of the details discussed with reference to those figures. The controller 404 may be similar to the controller 104 of FIGS. 1A through 1C and/or controller 304 of FIG. 3 except that except a comparator 449, a switch 447, and a control register 446 are used instead of a controlled voltage limiter (e.g., the controlled voltage limiter 146 of FIG. 1C, the controlled voltage limiter 346 of FIG. 3).

The controller 404 includes an error circuit 436, an internal supply circuit 438, a clamp circuit 440, a PWM circuit 442, and a driver circuit 444. The internal supply circuit 438 receives a supply voltage ($V_{supply}$) from a voltage supply terminal 430 and generates an internal voltage ($V_{internal}$).

The error circuit 436 receives a feedback signal 403 from a feedback terminal 428 and generates a regulation-reference signal 411. The error circuit 436 includes an error amplifier 448 having a first input (e.g., non-inverting input) configured to receive the feedback signal 403 and a second input (e.g., inverting input) configured to receive a first reference voltage provided by a voltage source 450. The error amplifier 448 may generate an error voltage 425. The error circuit 436 includes a comparator 449 having a first input (e.g., a non-inverting input) configured to receive the regulation-reference signal 411 and a second input (e.g., an inverting input) configured to receive the error voltage 425. In some examples, in response to the magnitude of the regulation-reference signal 411 being greater than the magnitude of the error voltage 425, the comparator 449 is configured to generate a logic high state. The error circuit 436 includes a switch 447 and a control register 446. In some examples, the control register 446 includes a closed SR flip-flop. In some examples, the control register 446 includes one or more shift registers or a multi-bit data register.

The control register 446 includes a set input configured to receive an output of the comparator 449, a reset input (e.g., an inverting input) configured to receive a limit signal 415 from the PWM circuit 442, and a clock input configured to receive a clock signal 427 from the PWM circuit 442.

The switch 447 has a first terminal connected to the output of the comparator 449 and a second terminal configured to receive a clamping voltage 413 from the clamp circuit 440. The output of the control register 446 is configured to control whether the switch 447 is in an open position (e.g., in which the output of the comparator 449 is disconnected from first input) or a closed position (e.g., in which the output of the comparator 449 is connected to the first input). In some examples, the switch 447 has a first terminal connected to the output of the comparator 449, a second terminal for receiving the clamping voltage 413, a third terminal for providing the regulation-reference signal 411, and a control terminal connected to the output of the control register 446. In some examples, the switch 447 selectively connects its third terminal to either its first or second terminal in response to the signal received at its control terminal.

During normal operation, when the peak current is below the predetermined limit, the control register 446 is set and the switch 447 is in the closed position. In this state, the comparator 449 is configured to operate in a buffer mode, which causes the regulation-reference signal 411 to correspond to the error voltage 425.

When a current sense signal 401 reaches the limit set by a current limit comparator 470, the current limit comparator 470 resets latch 482 of the PWM circuit 442, which causes the limit signal 415 to transition to a logic low state. The logic low state of the limit signal 415 resets the control register 446 and the controller 404 operates in a current limit mode. In the current limit mode, the switch 447 is in the open position and the magnitude of the regulation-reference signal 411 is controlled by the clamp circuit 440.

In the current limit mode, the comparator 449 operates in a comparator mode and compares the error voltage 425 to the regulation-reference signal 411. If the magnitude of the error voltage 425 is less than the regulation-reference signal 411, the output of the comparator 449 sets the control register 446 and the controller 404 returns to a normal operation mode. In this example, the comparator 449 may transition while the error voltage 425 crosses a voltage level corresponding to the peak current equaling the predetermined current limit. In this scenario, a capacitor 480 of the clamp circuit 440 is pre-charged to this level so that the clamp circuit 440 does not have to slew the magnitude of regulation-reference signal 411 from a large voltage difference (or if at all). Embodiments using this method of transitioning between operating modes may reduce or eliminate the transitioning time where subharmonic operations may occur.

The PWM circuit 442 may receive a current sense signal 401 from a current sense terminal 426 and generate a PWM output signal 475, which is provided to the driver circuit 444. Also, the PWM circuit 442 may generate a plurality of signals provided to the clamp circuit 440 such as a clock signal 427, a limit signal 415, and a regulation signal 417. The PWM circuit 442 may include a timing signal generator 464 configured to generate a clock signal 427 and a ramp signal 429, and a combination circuit 466 configured to combine the current sense signal 401 and the ramp signal 429 to generate a modified current sense signal 435. The PWM circuit 442 includes a current limit comparator 470 having a first input (e.g., non-inverting input) configured to receive the current sense signal 401 and a second input (e.g., an inverting input) configured to receive a second reference signal provided by a voltage source 468. The current limit comparator 470 is configured to generate a logic high level in response to the magnitude of the current sense signal 401 being greater than the second reference signal. The PWM circuit 442 includes a regulation comparator 478 having a first input (e.g., a non-inverting input) configured to receive the modified current sense signal 435 and a second input (e.g., an inverting input) configured to receive the regulation-reference signal 411. The PWM circuit 442 is configured to generate a logic high level in response to the magnitude of the modified current sense signal 435 being greater than the magnitude of the regulation-reference signal 411.

The PWM circuit 442 includes a latch 482 and a latch 484. In some examples, the latch 482 includes an SR latch. In some examples, the latch 484 includes an SR latch. The output of the current limit comparator 470 is connected to the latch 482. The output of the current limit comparator 470 may be connected to a reset input of the latch 482, and a set input of the latch 482 is configured to receive the clock signal 427. The output of the regulation comparator 478 is connected to the latch 484. The output of the regulation comparator 478 may be connected to a reset input of the latch 484, and a set input of the latch 484 is configured to receive the clock signal 427.

In response to the magnitude of the current sense signal 401 being greater than the second reference voltage, the current limit comparator 470 may generate a logic high level, which, when received at the reset input of the latch 482, causes the latch 482 to generate a limit signal 415, which is provided to the clamp circuit 440. In response to the magnitude of the modified current sense signal 435 being greater than the magnitude of the regulation-reference signal 411, the regulation comparator 478 may generate a logic high state, which, when received at the reset input of the latch 484, causes the latch 484 to generate a regulation signal 417, which is provided to the clamp circuit 440.

The PWM circuit 442 includes a logic circuit 486 configured to receive the clock signal 427, the output of the latch 482, and the output of the latch 484. In some examples, the logic circuit 486 includes AND gate with an inverted input configured to receive the clock signal 427, a first non-inverting input connected to the output of the latch 482, and a second non-inverting input connected to the output of the latch 484.

The logic circuit 486 is configured to generate a PWM output signal 475. The driver circuit 444 includes a gate driver 476. The gate driver 476 includes an input connected to the output of the logic circuit 486 and configured to receive the PWM output signal 475. The gate driver 476 is configured to generate the drive signal 405 in response to the PWM output signal 475. The gate driver 476 has an output connected to a drive terminal 434. The controller 404 also has a ground terminal 432.

The clamp circuit 440 is configured to monitor the limit signal 415 and the regulation signal 417 and adjust the magnitude of the clamping voltage 413. In the example of FIG. 4, the clamp circuit 440 also receives the clock signal 427. In some examples, the clamp circuit 440 adjusts the magnitude of the clamping voltage 413 to set a clamp limit level for the magnitude of the regulation-reference signal 411. The clamp circuit 440 includes a clamp control sequencer 462. The clamp control sequencer 462 may receive the limit signal 415, the regulation signal 417, and the clock signal 427, and may generate an increase signal 431 or a decrease signal 433.

The clamp control sequencer 462 may increase the magnitude of the clamping voltage 413 when the regulation signal 417 has a logic low level and may decrease the magnitude of the clamping voltage 413 when the limit signal 415 has a logic low state. The clamp circuit 440 includes a current source 451 connected to the internal voltage ($V_{internal}$), a switch 452, a switch 454, a current source 456 connected to ground (e.g., the ground terminal 432), and a capacitor 480 connected to ground (e.g., the ground terminal 432). The switch 452 has a first terminal connected to the current source 451 and a second terminal connected to node 455. The switch 452 is configured to receive the increase signal 431. In some examples, when the increase signal 431 is activated (e.g., a logic high state), the switch 452 transitions to the closed state, which causes the clamping voltage 413 to increase, thereby allowing more current through the inductor. The capacitor 480 has a first terminal connected to the node 455 and a second terminal connected to ground (e.g., the ground terminal 432).

The switch 454 has a first terminal connected to the node 455 and a second terminal connected to the current source 456. The switch 454 is configured to receive the decrease signal 433. In some examples, when the decrease signal 433 is activated (e.g., a logic high state), the switch 454 transitions to the closed state, which causes the clamping voltage 413 to decrease, thereby limiting the current through the inductor.

Figure 5:
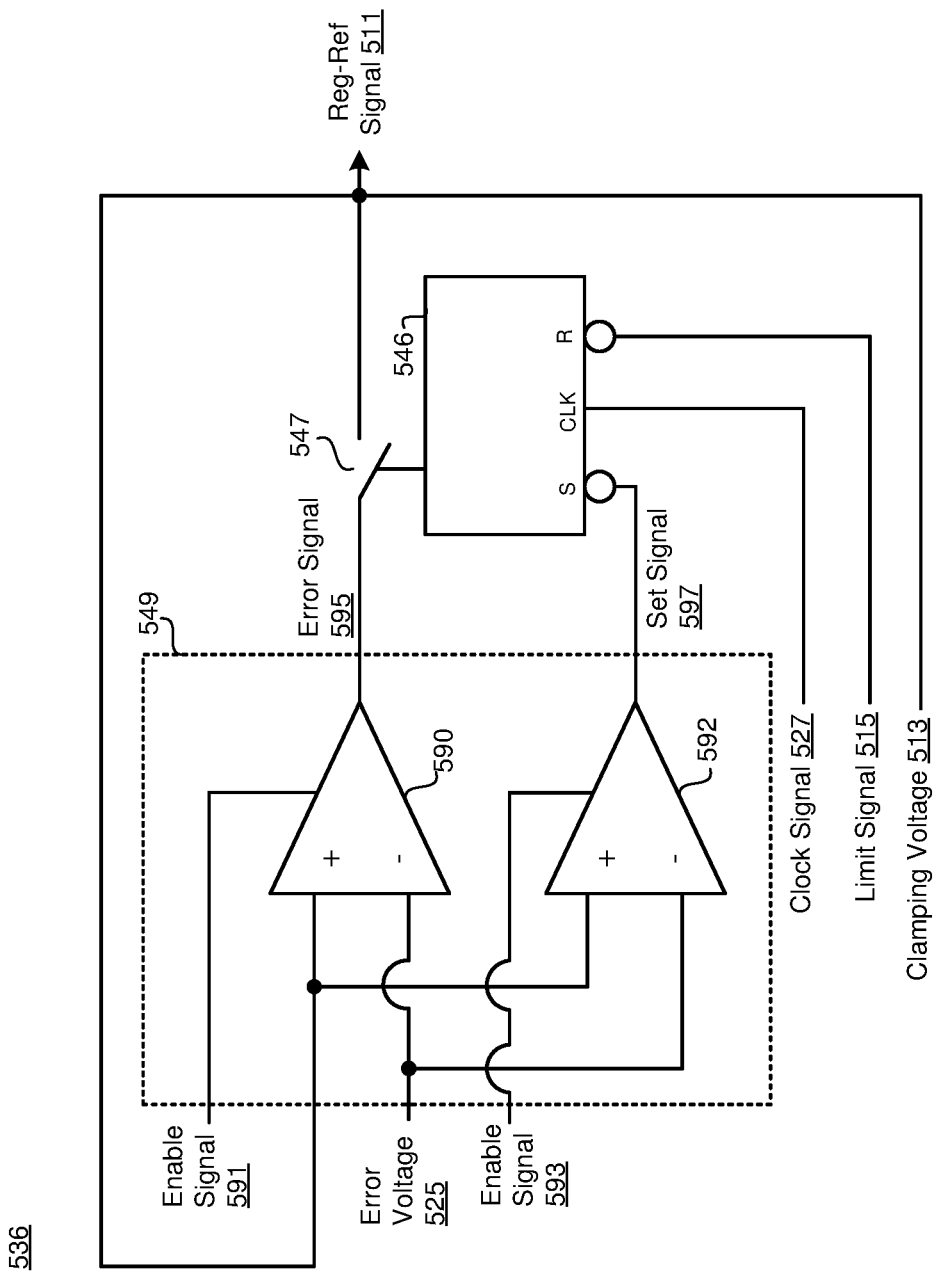
FIG. 5 illustrates an example of an error circuit of a controller of a switching regulator according to an aspect.

FIG. 5 illustrates a portion of an error circuit 536 according to an aspect. The error circuit 536 may be used in any of the controllers discussed herein. In some examples, an operational amplifier circuit 549 is used instead of the configuration of the comparator 449 of FIG. 4. The operational amplifier circuit 549 includes a buffer amplifier 590 and a comparator 592. The buffer amplifier 590 includes a first input (e.g., a non-inverting input) configured to receive a regulation-reference signal 511 and a second input (e.g., an inverting input) configured to receive an error voltage 525. The buffer amplifier 590 includes a control input configured to receive an enable signal 591. The regulation-reference signal 511 may be the regulation-reference signal 111 of FIGS. 1A through 1C, the regulation-reference signal 311 of FIG. 3, or the regulation-reference signal 411 of FIG. 4. The error voltage 525 may be the error voltage 125 of FIGS. 1A through 1C, the error voltage 325 of FIG. 3, or the error voltage 425 of FIG. 4.

The comparator 592 includes a first input (e.g., a non-inverting input) configured to receive the regulation-reference signal 511 and a second input (e.g., an inverting input) configured to receive the error voltage 525. The comparator 592 includes a control input configured to receive an enable signal 593.

Also, the error circuit 536 includes a switch 547 and a control register 546. The switch 547 may be an example of the switch 447 of FIG. 4, and the control register 546 may be an example of the control register 446 of FIG. 4. The switch 547 has a first terminal connected to the output of the buffer amplifier 590 and a second terminal configured to receive a clamping voltage 513 and provide the regulation-reference signal 511. The switch 547 has a control input connected to an output of the control register 546. The control register 546 includes a set input (e.g., an inverting input) configured to receive a set signal 597 (e.g., generated by the comparator 592), a clock input configured to receive a clock signal 527, and a reset input (e.g., an inverting input) configured to a limit signal 515.

The error circuit 536 may monitor the regulation-reference signal 511 and the error voltage 525 and may generate an error signal 595 or a set signal 597 depending on the operation mode of the controller. When the controller is in normal operation mode (or voltage regulation mode), the enable signal 591 is in an active state and the buffer amplifier 590 is enabled. The buffer amplifier 590 causes the regulation-reference signal 511 to correspond to the error voltage 525 during this mode via the feedback loop between the buffer amplifier's output and the inverting input when the switch 547 is closed.

When the controller is operating in a current limit mode, the enable signal 593 is in an active state and the comparator 592 is enabled. If the magnitude of the error voltage 525 is less than the magnitude of the regulation-reference signal 511, the enable signal 591 transitions to a logic low state and the control register 546 is set, thereby closing the switch 547 and causing the controller to enter into a normal operation mode. In some examples, the enable signal 591 is representative of the output of the control register 546 and the enable signal 593 is representative of the inverse of the output of the control register 546. In some examples, the error circuit 536 includes one or more components (e.g., a delay circuit) for delaying enabling the buffer amplifier 590 and/or the comparator 592. In some examples, a delay circuit is provided at the output of the comparator 592 to prevent prematurely setting the control register 546. In some examples, the inverting and non-inverting inputs of the comparator 592 are switched and the set input of the control register 546 is not inverted.

Figure 6:
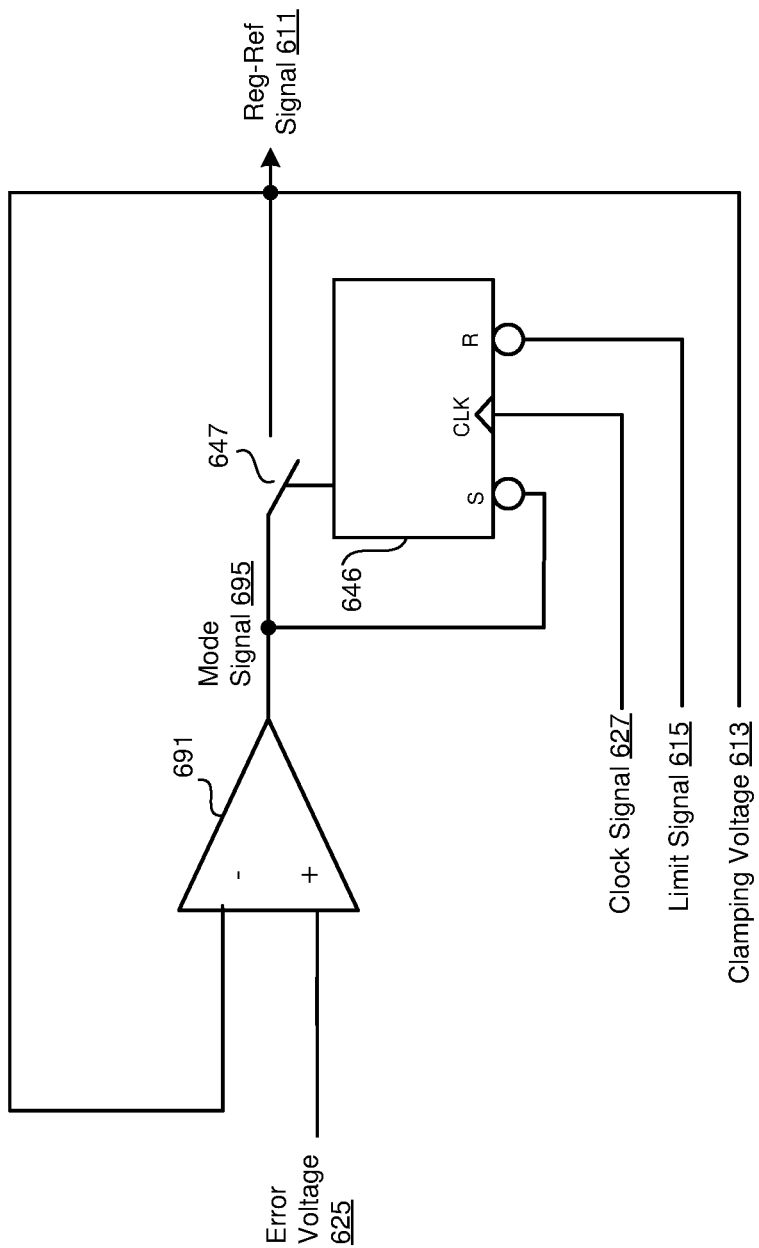
FIG. 6 illustrates an example of an error circuit of a controller of a switching regulator according to another aspect.

FIG. 6 illustrates a portion of an error circuit 636 according to an aspect. The error circuit 636 may be used in any of the controllers discussed herein. In some examples, a buffer amplifier 691 is used instead of an operational amplifier circuit 549 of FIG. 5. The error circuit 636 includes a buffer amplifier 691, a control register 646, and a switch 647. The buffer amplifier 691 includes a first input (e.g., an inverting input) configured to receive a regulation-reference signal 611 and a second input (e.g., a non-inverting input) configured to receive an error voltage 625. The first input may also be connected to the second terminal of the switch 647. The regulation-reference signal 611 may be the regulation-reference signal 111 of FIGS. 1A through 1C, the regulation-reference signal 311 of FIG. 3, or the regulation-reference signal 411 of FIG. 4. The error voltage 525 may be the error voltage 125 of FIGS. 1A through 1C, the error voltage 325 of FIG. 3, or the error voltage 425 of FIG. 4. The buffer amplifier 691 may output a mode signal 695.

The switch 647 has a first terminal connected to the output of the buffer amplifier 691 and a second terminal configured to receive a clamping voltage 613 and provide the regulation-reference signal 611. The second terminal of the switch 647 is also connected to the inverting input of the buffer amplifier 691. The switch 647 has a control input connected to an output of the control register 646. The control register 646 includes a set input (e.g., an inverting input) configured to receive the mode signal 695, a clock input configured to receive a clock signal 627, and a reset input (e.g., an inverting input) configured to a limit signal 615. In some examples, the mode signal 695 has a first state (e.g., a logic high state or logic low state) in response to the magnitude of the error voltage 625 being greater than the magnitude of the clamping voltage 613. In some examples, the mode signal 695 has a second state (e.g., a logic high state or logic low state) in response to the magnitude of the error voltage 625 being less than the magnitude of the clamping voltage 613.

The error circuit 636 may be similar to the error circuit 536 of FIG. 5 except the buffer amplifier 691 may perform both the buffing and amplifying operations. When the controller is operating in normal operation mode and the switch 647 is closed, the buffer amplifier 691 causes the regulation-reference signal 611 to correspond to the error voltage 625. When the controller is operating in the current limit mode, the switch 647 is open, and the buffer amplifier 691 operates as a comparator. In some examples, the set input of the control register 646 is configured so that the control register 646 is set when the mode signal 695 indicates that the magnitude of the error voltage 625 is lower than the regulation-reference signal 611. In some examples, the buffer amplifier 691 has a first output connected to the first terminal of the switch 647 for providing the mode signal 695 in a first state (e.g., logic high or low) and a second output connected to the set input of the control register 646 for providing the mode signal 695 in a second state (e.g., logic high or low). In some examples, the second output is configured to indicate when the magnitude of the error voltage 625 is less than the regulation-reference signal 611.

The switching regulators discussed herein may increase the accuracy of peak current limit regulation while avoiding overshoot faults and/or may maintain stable operation while operating near or at the current limit of an application. The switching regulators discussed herein may maintain high average output current with respect to the maximum peak current, the operating frequency, the voltages, and the components of a system. In some examples, the switching regulators discussed herein may be implemented in DC-DC converter applications without needing additional parameter setting components or signals. Although some examples have been described with respect to a single switch boost DC-DC converter, the switching regulator may have a variety of converter topologies and/or applications to provide a clamp control circuit. Some examples depict the power switch and controller as separate circuits, other implementations may integrate the power switch and controller in a monolithic integrated circuit package.

Figure 7:
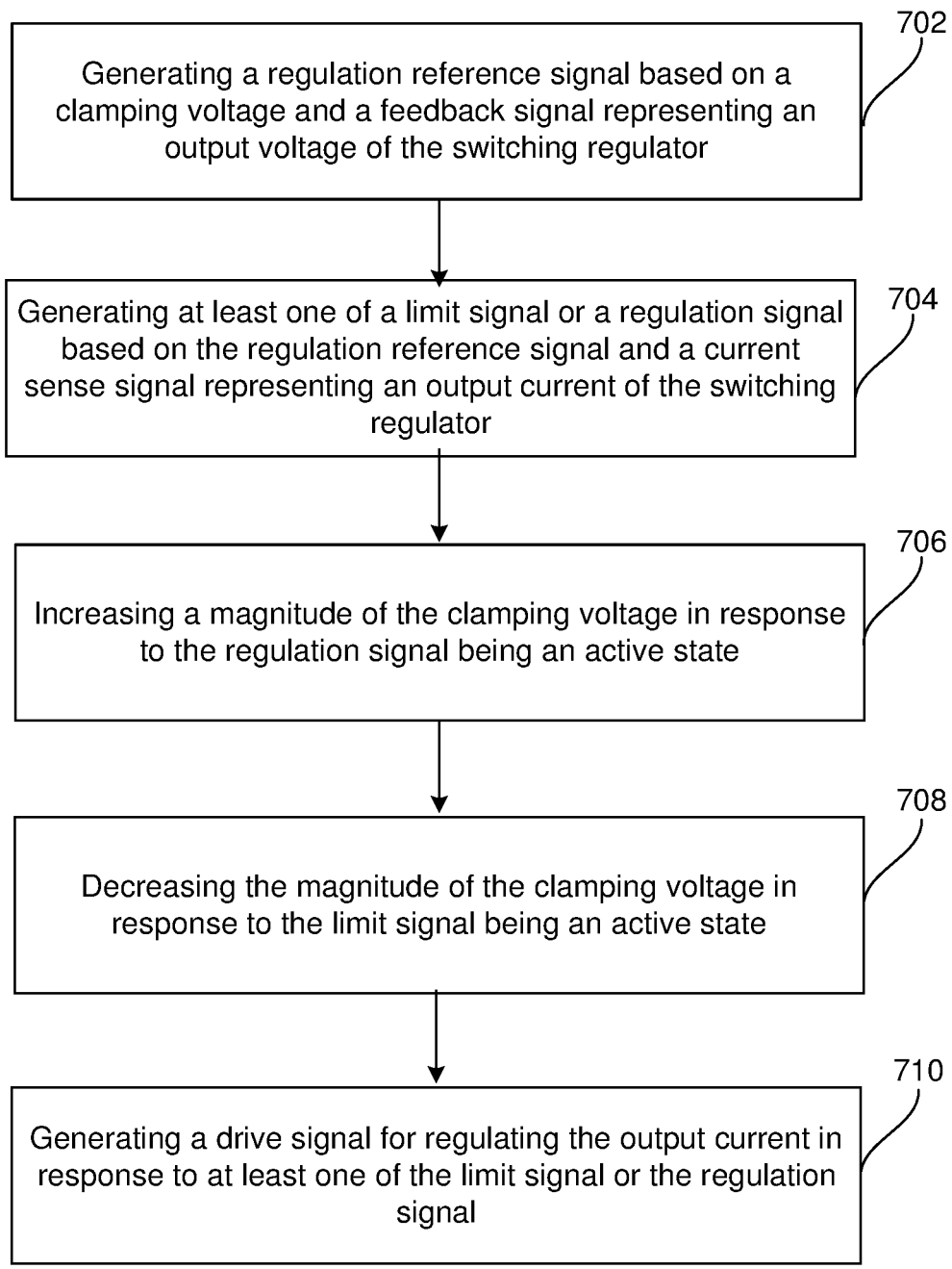
FIG. 7 illustrates a flowchart depicting example operations of a controller of a switching regulator according to an aspect.

FIG. 7 illustrates a flowchart 700 depicting example operations of a switching regulator according to an aspect. Although the flowchart 700 is explained with respect to the switching regulator 100 of FIGS. 1A through 1C, the flowchart 700 may be applicable to any of the embodiments discussed herein. Although the flowchart 700 of FIG. 7 illustrates the operations in sequential order, it will be appreciated that this is merely an example, and that additional or alternative operations may be included. Further, operations of FIG. 7 and related operations may be executed in a different order than that shown, or in a parallel or overlapping fashion.

Operation 702 includes generating a regulation-reference signal 111 based on a clamping voltage 113 and a feedback signal 103 representing an output voltage ($V_{out}$) of the switching regulator 100. Operation 704 includes generating at least one of a limit signal 115 or a regulation signal 117 based on the regulation-reference signal 111 and a current sense signal 101 representing an output current of the switching regulator 100. Operation 706 includes increasing a magnitude of the clamping voltage 113 in response to the regulation signal 117 being an active state. Operation 708 includes decreasing the magnitude of the clamping voltage 113 in response to the limit signal 115 being an active state. Operation 710 includes generating a drive signal 105 for regulating the output current in response to at least one of the limit signal 115 or the regulation signal 117.

Various implementations of the systems and techniques described here can be realized in digital electronic circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device. Various implementations of the systems and techniques described here can be realized as and/or generally be referred to herein as a circuit, a module, a block, or a system that can combine software and hardware aspects. For example, a module may include the functions/acts/computer program instructions executing on a processor (e.g., a processor formed on a silicon substrate, a GaAs substrate, and the like) or some other programmable data processing apparatus.

Some of the above example embodiments are described as processes or methods depicted as flowcharts. Although the flowcharts describe the operations as sequential processes, many of the operations may be performed in parallel, concurrently or simultaneously. In addition, the order of operations may be re-arranged. The processes may be terminated when their operations are completed but may also have additional steps not included in the figure. The processes may correspond to methods, functions, procedures, subroutines, subprograms, etc.

Methods discussed above, some of which are illustrated by the flow charts, may be implemented by hardware, software, firmware, middleware, microcode, hardware description languages, or any combination thereof. When implemented in software, firmware, middleware or microcode, the program code or code segments to perform the necessary tasks may be stored in a machine or computer readable medium such as a storage medium. A processor(s) may perform the necessary tasks.

Specific structural and functional details disclosed herein are merely representative for purposes of describing example embodiments. Example embodiments, however, be embodied in many alternate forms and should not be construed as limited to only the embodiments set forth herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term and/or includes any and all combinations of one or more of the associated listed items.

The terminology used herein is for the purpose of describing particular embodiments only and is not intended to be limiting of example embodiments. As used herein, the singular forms a, an, and the are intended to include the plural forms as well, unless the context clearly indicates otherwise. It will be further understood that the terms comprises, comprising, includes and/or including, when used herein, specify the presence of stated features, integers, steps, operations, elements and/or components, but do not preclude the presence or addition of one or more other features, integers, steps, operations, elements, components and/or groups thereof.

It should also be noted that in some alternative implementations, the functions/acts noted may occur out of the order noted in the figures. For example, two figures shown in succession may in fact be executed concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Portions of the above example embodiments and corresponding detailed description are presented in terms of software, or algorithms and symbolic representations of operation on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

In the above illustrative embodiments, reference to acts and symbolic representations of operations (e.g., in the form of flowcharts) that may be implemented as program modules or functional processes include routines, programs, objects, components, data structures, etc., that perform particular tasks or implement particular abstract data types and may be described and/or implemented using existing hardware at existing structural elements. Such existing hardware may include one or more Central Processing Units (CPUs), digital signal processors (DSPs), application-specific-integrated-circuits, field programmable gate arrays (FPGAs) computers or the like.

It should be borne in mind, however, that all of these and similar terms are to be associated with the appropriate physical quantities and are merely convenient labels applied to these quantities. Unless specifically stated otherwise, or as is apparent from the discussion, terms such as processing or computing or calculating or determining of displaying or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

Note also that the software implemented aspects of the example embodiments are typically encoded on some form of non-transitory program storage medium or implemented over some type of transmission medium. The program storage medium may be magnetic (e.g., a floppy disk or a hard drive) or optical (e.g., a compact disk read only memory, or CD ROM), and may be read only or random access. Similarly, the transmission medium may be twisted wire pairs, coaxial cable, optical fiber, or some other suitable transmission medium known to the art. The example embodiments not limited by these aspects of any given implementation.

Lastly, it should also be noted that whilst the accompanying claims set out particular combinations of features described herein, the scope of the present disclosure is not limited to the particular combinations hereafter claimed, but instead extends to encompass any combination of features or embodiments herein disclosed irrespective of whether or not that particular combination has been specifically enumerated in the accompanying claims at this time.

What is claimed is:

1. A controller for a switching regulator, the controller comprising:
   an error circuit configured to receive a clamping voltage and a feedback signal representing an output voltage of the switching regulator, the error circuit configured to generate a regulation reference signal based on the clamping voltage and the feedback signal;
   a pulse width modulation (PWM) circuit configured to receive the regulation reference signal and a current sense signal representing an output current of the switching regulator, the PWM circuit configured to generate a limit signal and a regulation signal based on the regulation reference signal and the current sense signal;
   a clamp circuit configured to increase a magnitude of the clamping voltage in response to the regulation signal being an active state and decrease the magnitude of the clamping voltage in response to the limit signal being the active state, the clamp circuit including a clamp control sequencer configured to receive a clock signal and adjust the magnitude of the clamping voltage using the clock signal; and
   a drive circuit configured to generate a drive signal for regulating the output current using the regulation reference signal.

2. The controller of claim 1, wherein the error circuit includes:
   an error amplifier configured to generate an error voltage based on a difference of a magnitude of the feedback signal and a reference voltage.

3. The controller of claim 2, wherein the error circuit includes:
   a voltage limiter configured to generate the regulation reference signal based on the error voltage and the clamping voltage.

4. The controller of claim 2, wherein the error circuit includes:
   a comparator connected to an output of the error amplifier;
   a switch connected to an output of the comparator; and a control register connected to a control input of the switch.

5. The controller of claim 1, wherein the PWM circuit includes:
a current limiter comparator configured to activate the limit signal in response to a magnitude of the current sense signal being greater than a first reference voltage.

6. The controller of claim 5, wherein the PWM circuit includes:
a combination circuit configured to combine a ramp signal with the current sense signal to generate a modified current sense signal; and
a regulation comparator configured to activate the regulation signal in response to a magnitude of the modified current sense signal being greater than a second reference voltage.

7. The controller of claim 1, wherein the clamp control sequencer is configured to generate an increase signal in response to the regulation signal being activated, the clamp control sequencer configured to generate a decrease signal in response to the limit signal being activated.

8. The controller of claim 7, wherein:
in response to the increase signal, the clamp control sequencer is configured to cause a first switch to transition to a closed position to connect a first current source to a capacitor, the first current source being connected to an internal voltage,
in response to the decrease signal, the clamp control sequencer is configured to cause a second switch to transition to a closed position to connect a second current source to the capacitor, the second current source being connected to ground.

9. The controller of claim 1, wherein the PWM circuit includes:
a current limit comparator configured to cause activation of the limit signal;
a regulation comparator configured to cause activation of the regulation signal; and
one or more latches connected to at least one of an output of the current limit comparator or an output of the regulation comparator.

10. A controller for a switching regulator, the controller comprising:
an error circuit configured to receive a clamping voltage and a feedback signal representing an output voltage of the switching regulator, the error circuit configured to generate a regulation reference signal based on the clamping voltage and the feedback signal;
a pulse width modulation (PWM) circuit including a current limit comparator configured to activate a limit signal in response to a magnitude of a current sense signal representing an output current being greater than a first reference voltage, and a regulation comparator configured to activate a regulation signal in response to a modified current sense signal being greater than the regulation reference signal;
a clamp circuit configured to increase a magnitude of the clamping voltage in response to the regulation signal being activated and decrease the magnitude of the clamping voltage in response to the limit signal being activated, the clamp circuit including a clamp control sequencer configured to receive a clock signal and adjust the magnitude of the clamping voltage using the clock signal; and
a drive circuit configured to generate a drive signal for regulating the output current using the regulation reference signal.

11. The controller of claim 10, wherein the PWM circuit includes a combination circuit configured to combine a ramp signal with the current sense signal to generate the modified current sense signal.

12. The controller of claim 10, wherein the error circuit includes:
an error amplifier configured to generate an error voltage based on a difference of a magnitude of the feedback signal and a second reference voltage; and
a voltage limiter configured to generate the regulation reference signal based on the error voltage and the clamping voltage.

13. The controller of claim 10, wherein the error circuit includes:
an error amplifier configured to generate an error voltage based on a difference of a magnitude of the feedback signal and a second reference voltage;
a comparator connected to an output of the error amplifier;
a switch connected to an output of the comparator; and
a control register connected to a control input of the switch.

14. The controller of claim 10, wherein the PWM circuit includes:
a timing signal generator configured to generate a clock signal;
a logic circuit connected to an output of the current limit comparator and an output of the regulation comparator; and
a latch having a first input configured to receive the clock signal and a second input connected to an output of the logic circuit.

15. The controller of claim 10, wherein the PWM circuit includes:
a timing signal generator configured to generate a clock signal;
a first latch having a first input connected to an output of the current limit comparator and a second input configured to receive the clock signal;
a second latch having a first input connected to an output of the regulation comparator and a second input configured to receive the clock signal; and
a logic circuit having a first input connected to an output of the first latch, a second input connected to an output of the second latch, and a third input configured to receive the clock signal.

16. The controller of claim 10, wherein the clamp circuit includes:
a first current source connected to an internal voltage;
a second current source connected to ground;
a first switch connected to the first current source and a node, the first switch configured to transition to a closed state in response to the limit signal being activated;
a second switch connected to the second current source and the node, the second switch configured to transition to a closed state in response to the regulation signal being activated; and
a capacitor connected to the node.

17. A method of controlling a switching regulator, the method comprising:
generating a regulation reference signal based on a clamping voltage and a feedback signal representing an output voltage of the switching regulator;
generating a limit signal and a regulation signal based on the regulation reference signal and a current sense signal representing an output current of the switching regulator;

receiving a clock signal;
adjusting a magnitude of the clamping voltage using the clock signal, including:
   increasing the magnitude of the clamping voltage in response to the regulation signal being an active state; and
   decreasing the magnitude of the clamping voltage in response to the limit signal being an active state; and
generating a drive signal for regulating the output current using the regulation reference signal.

18. The method of claim 17, further comprising:
activating the limit signal in response to a magnitude of the current sense signal being greater than a reference voltage.

19. The method of claim 17, further comprising:
generating a ramp signal;
combining the ramp signal with the current sense signal to generate a modified current sense signal; and
activating the regulation signal in response to a magnitude of the modified current sense signal being greater than a reference voltage.

\* \* \* \* \*